(12) United States Patent
Tajima et al.

(10) Patent No.: US 6,292,083 B1
(45) Date of Patent: *Sep. 18, 2001

(54) SURFACE-MOUNT COIL

(75) Inventors: Takashi Tajima, Annaka; Katsutoshi Kuroiwa, Shibukawa, both of (JP)

(73) Assignee: Taiyo Yuden Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/461,217

(22) Filed: Dec. 16, 1999

Related U.S. Application Data

(63) Continuation-in-part of application No. 09/275,005, filed on Mar. 24, 1999, now abandoned.

(30) Foreign Application Priority Data

Mar. 27, 1998 (JP) .................................................. 10-081079

(51) Int. Cl.⁷ .............................. H01F 27/29; H01F 27/30
(52) U.S. Cl. ............................. 336/192; 336/209; 336/210
(58) Field of Search ..................................... 336/192, 209, 336/210, 196; 338/22 R

(56) References Cited

U.S. PATENT DOCUMENTS

| | | | | |
|---|---|---|---|---|
| 5,153,549 | * | 10/1992 | Morinaga | 336/177 |
| 5,457,872 | * | 10/1995 | Sakata et al. | 29/605 |
| 5,530,416 | * | 6/1996 | Wakamatsu et al. | 336/192 |
| 5,831,510 | * | 11/1998 | Zhang et al. | 338/22 R |
| 5,864,281 | * | 1/1999 | Zhang et al. | 338/22 R |

FOREIGN PATENT DOCUMENTS 9-213539A * 8/1997 (JP) .

* cited by examiner

*Primary Examiner*—Anh Mai
(74) *Attorney, Agent, or Firm*—Townsend & Banta

(57) ABSTRACT

A structure of a surface-mount coil is provided which prevents a decrease in the fixing strength between the core and the lead frame of the surface-mount coil when soldering of a surface-mount coil to a mount board.

Specifically, the structure of the surface mount coil of the present invention suppresses movement and diffusion of molten solder to lower faces of the core placing portions when soldering the external connection terminals to electrode lands of the mount board. The molten solder is detained on the electrode lands to form sufficient solder fillet on the external connection terminals, resulting in suppression of generation of defects in soldering and prevention of decreases in the fixing strength between the core and the lead frame by preventing heat transfer to the upper surface of the core mount portion of the surface mount coil.

2 Claims, 3 Drawing Sheets

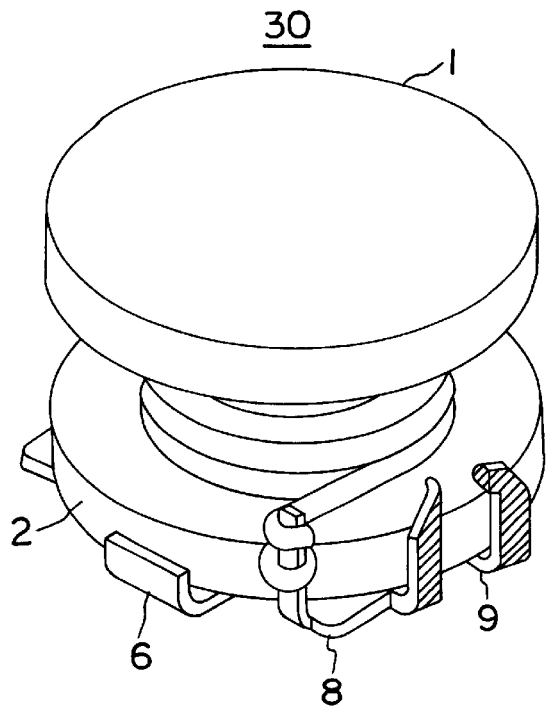
F I G. 1
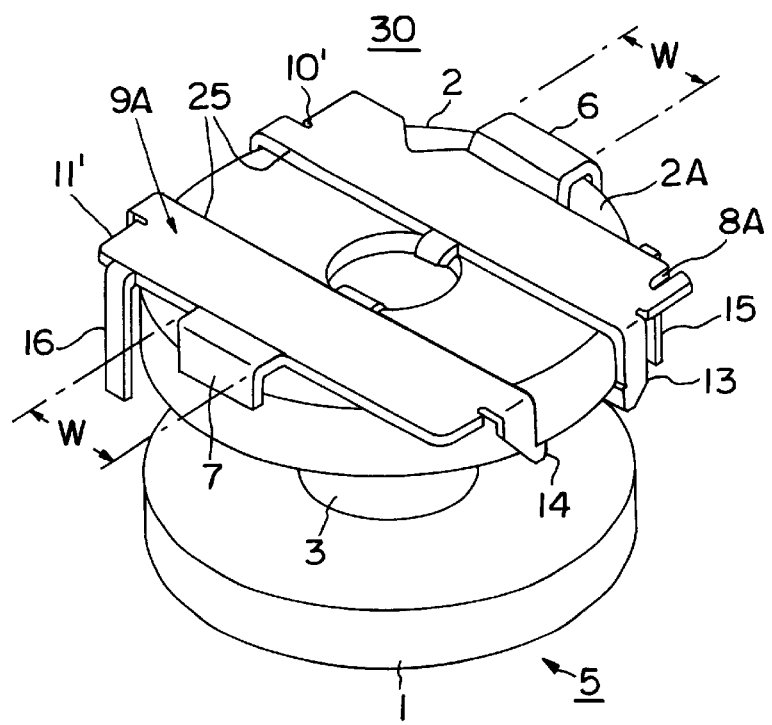
F I G. 2

SURFACE-MOUNT COIL

CROSS REFERENCE TO A RELATED APPLICATIONS

This is a Continuation-In-Part patent application of application Ser. No. 09/275,005 filed Mar. 24, 1999 now abandoned.

FIELD OF THE INVENTION

The present invention relates in general to a surface-mount coil, such as a choke coil, and more particularly, to a structure of lead frames of a surface-mount coil in which a plurality of external connection terminals are directly disposed on a bottom face side of a lower flange portion of a drum-shaped core body.

BACKGROUND OF THE INVENTION

Conventionally, a structure in which a core comprising a wind frame portion provided with winding, and an upper and lower flange portions formed to extend at opposite ends of the wind frame portion is fixed by bonding to a pedestal made of synthetic resin mounted with external connection terminals. Further, end portions of the winding are tied to and soldered to roots of the external connection terminals as a main stream of the surface-mount coil such as the choke coil.

Recently, however, a structure wherein lead frames having external connection terminals are directly fixed through an adhesive or the like to the bottom face of the lower flange portion of the core made of ferrite, ceramic, or the like, for example, has been frequently employed in order to decrease the height. Such external connection terminals are separated from the core, and the base of the core is bonded only to the core mount surfaces of the lead frames.

FIG. 6 is a perspective view of a conventional surface-mount coil seen from a bottom face side (mount board side) and which is of a type as disclosed in Japanese Patent Application Laid-open No. 9-213539, wherein an electrode is directly fixed by bonding to the lower flange portion of the drum-shaped core.

In FIG. 6, a surface-mount coil 20 comprises a coil body including a core 5, and a wind frame portion 3 of which winding (not shown) is applied. The core 5 having the wind frame portion 3 and upper and lower flange portions 1 and 2 is formed to extend at opposite ends of the wind frame portion 3. Lead frames 10 and 11, include external connection terminals 6 and 7 to be surfaces of which solderable layers (such as tinning layers, copper plating layers, gold plating layers, solder plating layers, and the like which have a solder wetting property equal to or better than that of lead frame material) are bonded. Core placing portions 8 and 9 extend from the external connection terminals and have widths larger than widths W of the external connection terminals. A bottom face of the lower flange portion 2 of the coil body is fixed by bonding with an adhesive or the like to upper faces 8a and 9a (lower invisible faces in FIG. 6) of the core placing portions 8 and 9 of the lead frames, and end portions of the winding are conductively connected by soldering to packing terminals 15 and 16 of lead frames 10 and 11.

Height differences H are formed at boundary portions between the external connection terminals 6 and 7 and the core placing portions 8 and 9. The external connection terminals are separated from the core, and the base of the core is bonded only to the core mount surfaces of the lead frames. Reference numerals 13 and 14 designate engaging projections formed on the lead frames 10 and 11 for positioning lead frames 10 and 11 on the coil body.

In the above-described conventional surface-mount coil 20, by disposing the wide core placing portions 8 and 9 higher (by height differences H) than external connection terminals 6 and 7 on the lead frames 10 and 11 (by a bending process), insulation between a wiring pattern in the mount board face right under the lead frames and the lead frames can be maintained.

PROBLEMS TO BE SOLVED BY THE INVENTION

However, as the size and a height of this conventional surface-mount coil 20 are further decreased, it is necessary to decrease the height differences H. However, when the surface-mount coil 20 is mounted on electrode lands of a circuit board coated with solder paste and the solder paste is melted and hardened in a reflow soldering furnace to solder the electrode lands to the external connection terminals 6 and 7 of the surface-mount coil, molten solder moves and diffuses from surfaces of the external connection terminals 6 and 7 of the lead frames 10 and 11 toward lower faces of the core placing portions 8 and 9. As a result, if a solder adhesion preventing layer is not provided on the lower surface of the core placing portions 8 and 9, heat from the diffused molten solders is conducted to the upper surface of the core placing portions 8 and 9, thereby melting the solder bondable layer.

On the other hand, in response to recent rising tide of environmental protection, a movement for removing lead included in conventional solder has been promoted. Use of lead-free solder (including approximately 96 wt % of tin, and 4 wt % of silver, bismuth, copper, or a mixture of them as the remainder) is considered to increase in the future.

However, because the melting point of the lead-free solder is higher than that of low-temperature solder (tin-lead eutectic solder including about 10% of lead and having a melting point of about 220° C.) which is used conventionally, wetting cannot be obtained unless the temperature of the external connection terminals 6 and 7 of the lead frames 10 and 11 is sufficiently increased during soldering. On the other hand, since the lead frames 10 and 11 are inevitably exposed to high temperatures for a long period in this case, the molten solder can easily enter to reach the core placing portions 8 and 9 during heating at high temperatures. As a result, the above problem of the defect in soldering is further highlighted.

For example, if the surface-mount coil 20 is soldered to the electrode land of the circuit board, molten solders are diffused through the lower surfaces of the core mount portions 8 and 9 and the heat of the diffused molten solders are conducted to upper surfaces 8a and 9a of the core mount portion 8. The solder bondable layer 31 (solder plating or the like) is molten by the heat. As a result, the fixing strength between the core 5, which is only bonded onto the upper surfaces 8a and 9a of the core mount portions 8 and 9, and the core mount portions 8 and 9 of the lead frame 10 disadvantageously decreases.

OBJECTS OF THE INVENTION

The object of the present invention, with the above circumstances in view, is to provide a surface-mount coil having a structure which prevents decrease in the fixing strength between the core and the lead frames, as encountered with prior art devices.

SUMMARY OF THE INVENTION

To achieve the above object, according to the present invention, there is provided in one embodiment a surface-mount coil comprising a coil body including a core to a wind frame portion of which winding is applied, the core having the wind frame portion and upper and lower flange portions formed to extend at opposite ends of the wind frame portion. Lead frames include external connection terminals to surfaces of which solderable layers are bonded, and core placing portions extend from the external connection terminals and have widths larger than widths of the external connection terminals. The coil body is fixed by bonding to upper faces of the core placing portions of the lead frames, and end portions of the winding are conductively connected to the lead frames, wherein solder adhesion preventing layers are formed at lower faces of the core placing portions of the lead frames.

To achieve the above object, according to the present invention, there is provided yet another embodiment where a surface-mount coil according to the above embodiments have solder adhesion preventing layers formed before forming of the solderable layers.

BRIEF DESCRIPTION OF THE DRAWINGS

Embodiments of the present invention will be specifically described based on the drawings. The same reference numerals and/or letters are used to refer to numbers similar to those of prior art.

FIG. 1 is a perspective view of one embodiment of a surface-mount coil according to the present invention;

FIG. 2 is a perspective view (winding omitted) of the surface-mount coil of FIG. 1 when viewed from a back face side thereof;

DETAILED DESCRIPTION OF THE INVENTION

Figure 3:
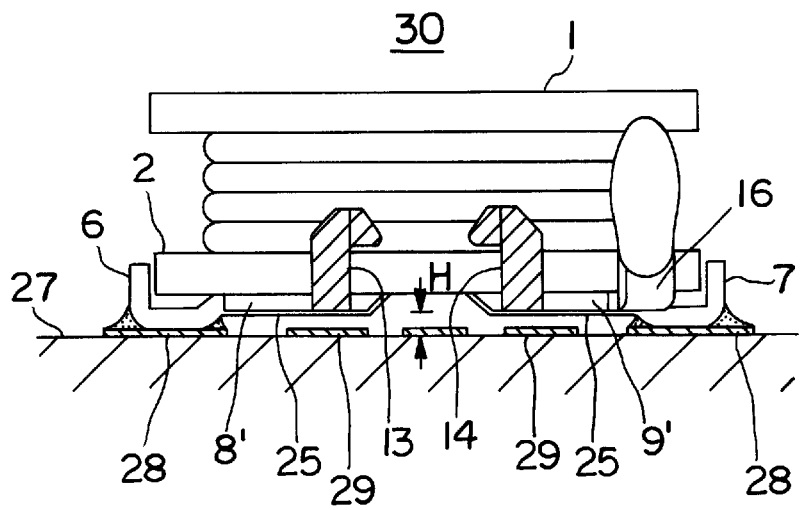
FIG. 3 is a side view of the surface-mount coil of FIG. 1 when mounted on a mount board face.

In FIGS. 1–4, a surface-mount coil 30 (e.g., choke coil) according to the present invention comprises a coil body including a core 5 with a wind frame portion 3 on which windings are applied. The core 5 having the wind frame portion 3 and upper and lower flange portions 1 and 2 is formed to extend at opposite ends of the wind frame portion 3. Lead frames 10' and 11' including external connection terminals 6 and 7, have surfaces to which solderable layers (such as tinning or solder plating with a thickness of 1 to 20 μm) are bonded, and core placing portions 8 and 9 extend at positions higher than the external connection terminals by height differences H and have widths larger than widths W of the external connection terminals similar to the above-described conventional surface-mount coil 20.

A bottom face 2A of the lower flange portion 2 of the coil body is fixed by bonding through an adhesive or the like to upper faces (lower invisible faces in FIG. 2) of the core placing portions 8 and 9 of the lead frames. End portions of the winding are conductively connected by soldering to packing terminals 15 and 16 of the lead frames 10' and 11'.

Figure 4:
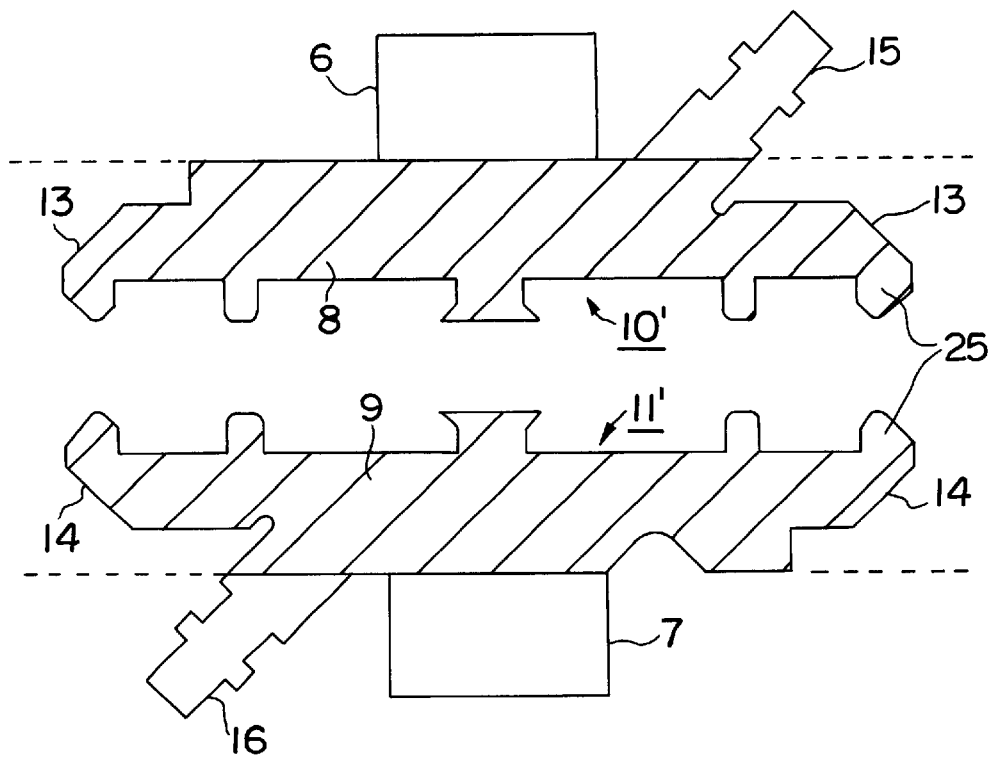
FIG. 4 is an enlarged view showing shapes of lead frames of the present invention.

In addition to the above structure, the lead frames 10' and 11' are particularly characterized in that the lower faces 8A and 9A (on a mount board 27 side in FIG. 3 and the upper visible faces in FIG. 2) of the core placing portions 8 and 9 which are not in contact with the core 5 are provided with solder adhesion preventing layers 25 (black-colored portions in FIG. 2 and diagonally shaded areas in FIG. 4).

The solder adhesion preventing layer 25 is a layer having such a property that solder hardly adheres to the layer as compared with the lead frame material metal, and is a layer formed by hardening synthetic resin such as epoxy resin, fluoroplastics, or borosilicate glass paste and having a thickness of about 10 to 200 μm.

When electrode lands 28 of a mount board 27 and the external connection terminals 6 and 7 of the surface-mount coil 30 are soldered to each other, diffusion of molten solder to the lower faces of the core placing portions 8 and 9 is suppressed by the solder adhesion preventing layers 25 on the lower faces of the core placing portions 8 and 9 of the lead frames 10' and 11'. As a result, the molten solder is detained on the electrode lands 28 to form a sufficient solder fillet on the external connection terminals 6 and 7, and, thus, a defect in soldering is not easily generated, and a desirable appearance of soldering can be obtained.

Figure 5:
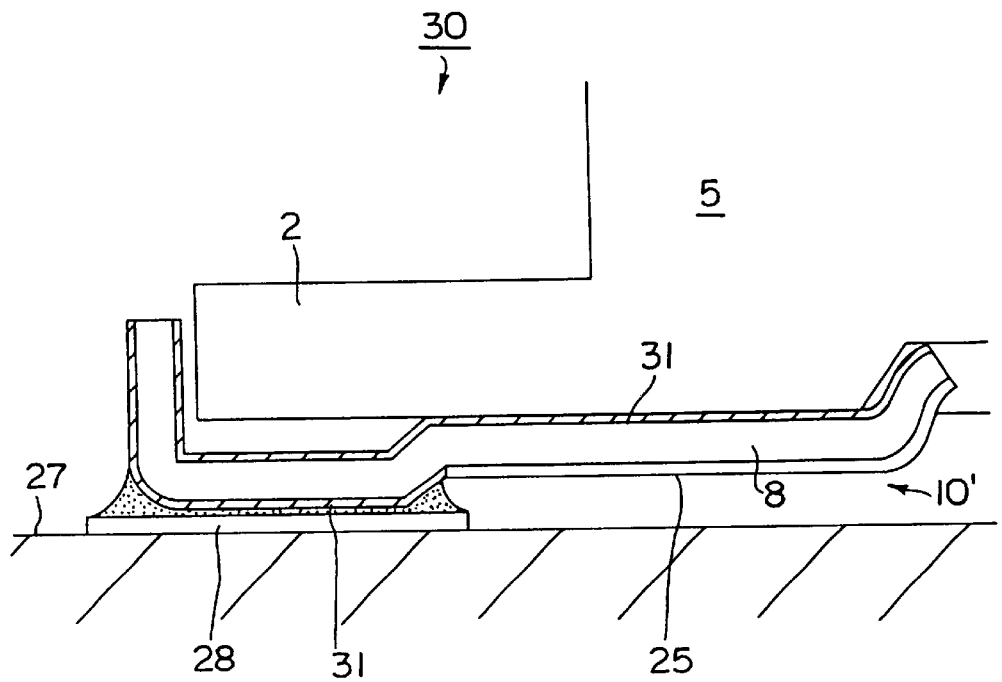
FIG. 5 is an enlarged view showing a state of soldering of external connection terminals and core placing portions of the lead frame of the surface-mount coil of FIG. 1.
Figure 6:
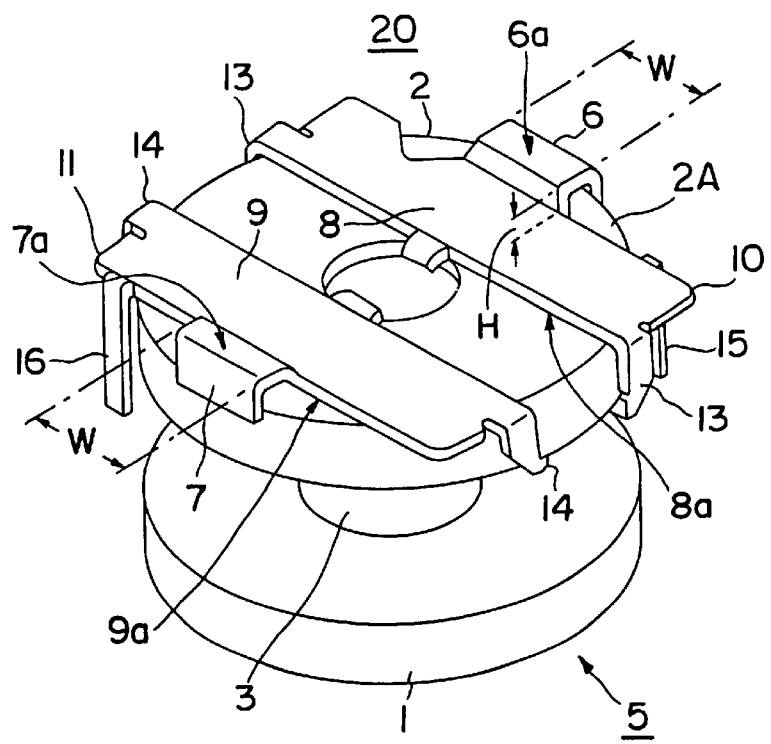
FIG. 6 is a perspective view of a conventional surface-mount coil viewed from a bottom face side.

As shown in FIG. 5, the surface-mount coil 30 is characterized in that the solder adhesion preventing layers 25 are formed before forming of the solderable layers 31 (by immersing an entire metal frame 40 in a plating bath, for example).

In other words, the solder adhesion preventing layers 25 are formed by printing, transcription, or the like on belt-shaped metal plates (material of which is phosphor bronze, bronze, copper, or the like). Then, bending of the external connection terminals 6 and 7 is effected and solder plating treatment of the external connection terminals 6 and 7 and the packing terminals 15 and 16 is carried out.

In this structure, because the solder adhesion preventing layers 25 are formed directly on lower faces of the core placing portions 8 and 9 of the lead frames 10' and 11', a securing strength of the solder adhesion preventing layers 25 is large. Therefore, when the surface-mount coil 30 is soldered to the mount board 27, the solder adhesion preventing layers 25 are not peeled off, even if the solderable layers 31 formed by tinning or solder plating are melted by the heat of soldering. If the solder adhesion preventing layers 25 are formed after forming of the solderable layers 31 on entire lead frames, the solder adhesion preventing layers 25 are peeled off as the solderable layers 31 are melted and softened due to heat generated in soldering.

EFFECTS OF THE INVENTION

Because the surface-mount coil according to the present invention has a lead frame structure provided with the solder adhesion preventing layers as described above, (1) the coil has an excellent effect of suppressing movement and diffusion of the molten solder in soldering (reflow soldering) of the external connection terminals to the electrode lands of the mount board by the solder adhesion preventing layers, and suppressing generation of defects in soldering;

(2) Separate circuit wiring patterns can be disposed right under the surface-mount coil mounted on the mount board to which the surface-mount coil is mounted while decreasing the height of the surface-mount coil, thereby contributing to an increase in density;

(3) Because the solder adhesion preventing layers are formed on the lead frame surfaces before forming of the solderable layers, the solderable layers do not exist in interfaces between the lead frame surfaces and the solder adhesion preventing layers, even if a set temperature of the reflow solder is higher than that of the conventional tin-lead eutectic solder, such as a lead-free solder. Therefore, even if the solderable layers are melted and softened in the heat treatment, the securing strength of the solder adhesion preventing layers is not easily decreased; and (4) By forming the solder adhesion preventing layer of the core mount portion of the lead frame, heat of the diffused molten solders is not conducted to the upper surface of the core mount portion, thus preventing decrease in the fixing strength between the core and the lead frame.

Explanation of Reference Numerals 1 upper flange portion
2 lower flange portion
2A bottom face of lower flange portion
3 wind frame portion
5 core
6, 7 external connection terminals
8, 9 core placing portions
8a, 9a upper faces of core placing portions
8A, 9A lower faces of core placing portions
10, 11, 10', 11' lead frames
13, 14 engaging projections
15, 16 packing terminals
20, 30 surface-mount coil
25 solder adhesion preventing layer
27 mount board
28 electrode land
29 circuit wiring pattern
31 solderable layer
H height difference
W width of external connection terminal

What is claimed is:

1. A surface-mount coil comprising:
a coil body including a core having a wind frame portion on which winding is applied, said core having the wind frame portion and upper and lower flange portions formed to extend at opposite ends of the wind frame portion;
lead frames having external connection terminals with surfaces on which solderable layers are bonded, core placing portions extending from said external connection terminals and having widths larger than widths of said external connection terminals, said coil body being fixed by bonding to upper faces of the core placing portions of the lead frames, and end portions of the winding being conductively connected to the lead frames,
the improvement comprising solder adhesion preventing layers formed upon lower faces of the core placing portions of the lead frames to prevent a decrease in adhesive strength between the core and the lead frame.

2. A surface-mount coil according to claim 1, wherein the solder adhesion preventing layers are formed before forming of the solderable layers.

* * * * *